US 6,695,630 B1

(12) United States Patent
Ku

(10) Patent No.: US 6,695,630 B1
(45) Date of Patent: Feb. 24, 2004

(54) CONNECTOR ASSEMBLY FOR A MEMORY MODULE

(75) Inventor: Yueh-Chu Ku, Taipei (TW)

(73) Assignee: Egbon Electronics Ltd., Taipei (TW)

( * ) Notice: Subject to any disclaimer, the term of this patent is extended or adjusted under 35 U.S.C. 154(b) by 0 days.

(21) Appl. No.: 10/328,488

(22) Filed: Dec. 23, 2002

(51) Int. Cl.⁷ .............................................. H01R 13/62
(52) U.S. Cl. ........................ 439/152; 439/155; 439/160
(58) Field of Search ................................ 439/152, 155, 439/160

(56) References Cited

U.S. PATENT DOCUMENTS

| 3,932,016 | A | * | 1/1976 | Ammenheuser | 439/377 |
|---|---|---|---|---|---|
| 4,052,092 | A | * | 10/1977 | Bergen | 292/172 |
| 4,197,572 | A | * | 4/1980 | Aimar | 361/755 |
| 4,363,942 | A | * | 12/1982 | Deeg et al. | 200/5 A |
| 5,014,956 | A | * | 5/1991 | Kayali | 248/311.2 |
| 5,745,347 | A | * | 4/1998 | Miller et al. | 361/813 |
| 5,993,241 | A | * | 11/1999 | Olson et al. | 439/378 |
| 6,030,245 | A | * | 2/2000 | Choy | 439/328 |
| 6,168,450 | B1 | * | 1/2001 | Davis et al. | 439/327 |
| 6,250,938 | B1 | * | 6/2001 | Tung | 439/160 |

* cited by examiner

Primary Examiner—Dean A. Reichard
Assistant Examiner—Anton Harris
(74) Attorney, Agent, or Firm—Alan Kamrath; Rider Bennett, LLP

(57) ABSTRACT

A connector assembly for a memory module includes a body having two standing pivot seats and two fasteners pivotally connected to the two pivot seats respectively. Each standing pivot seat has two recessed guides and two through pivot holes communicating with two recessed guides. Each fastener has a front and rear wall. Each front and rear wall has a protruding detent and a pivot pin. The protruding detents and the pivot pins correspond to the two recessed guides respectively. The pivot pins are inserted into the two through pivot holes when the fastener is mounted in the standing pivot seat so the fastener can pivot in the standing pivot seat to easily mount the memory module. In addition, the protruding detents press against the two recessed guides to hold the position of the fastener in the standing pivot seat, so the fastener can securely hold the memory module.

20 Claims, 6 Drawing Sheets

CONNECTOR ASSEMBLY FOR A MEMORY MODULE

BACKGROUND OF THE INVENTION

1. Field of the Invention

The present invention relates to a connector assembly for a memory module, more specifically to a connector assembly on a main circuit board of a personal computer, which easily and securely holds a memory module.

2. Description of Related Art

In order to upgrade frictions of a personal computer (PC), a main circuit board of the PC has many spare connectors, such as interface card bus connectors and memory module connectors. An operator can buy matched interface cards or memory modules by himself to insert into the connectors to upgrade the other functions or increase memory. Therefore, the connectors on the main circuit board have to provide an easy and secure means of inserting and holding memory modules.

Therefore, the present invention provides a connector assembly to fulfill the aforementioned requirements.

SUMMARY OF THE INVENTION

An objective of the present invention is to provide a connector assembly that is easily operated and securely holds a memory module.

Other objectives, advantages and novel features of the invention will become more apparent from the following detailed description when taken in conjunction with the accompanying drawings.

DETAILED DESCRIPTION OF THE PREFERRED EMBODIMENT

Figure 5:
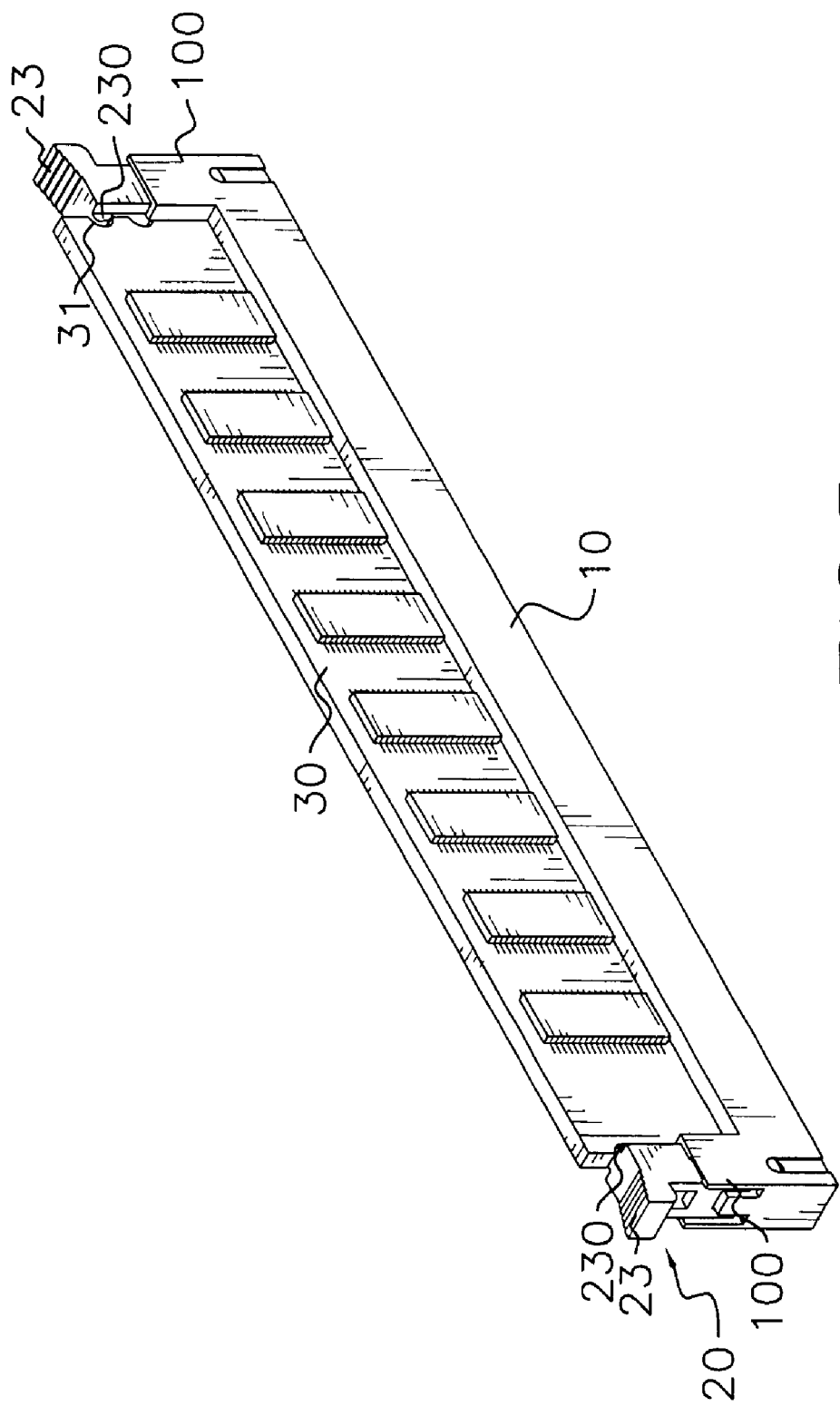
FIG. 5 is perspective view of the connector assembly in FIG. 1 with a memory module.

A connector assembly in accordance with the present invention holds a memory module (30). With reference to FIG. 5, the memory module (30) has two ends (not numbered), a knife edge with contacts and an outer edge. A semicircular notch (31) is defined in each end.

Figure 1:
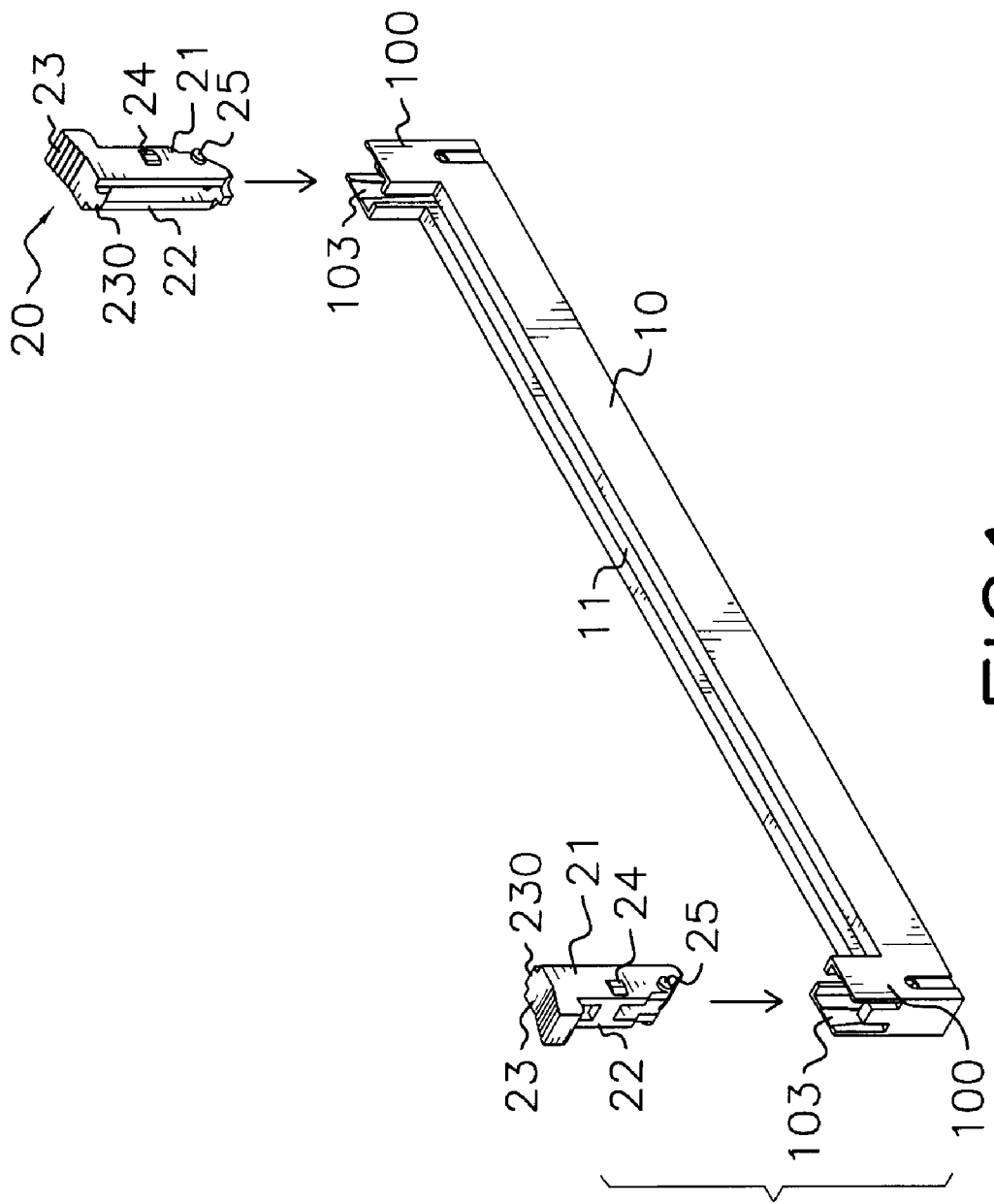
FIG. 1 is an exploded perspective view of a connector assembly for a memory module in accordance with the present invention.

With reference to FIG. 1, the connector assembly has a body (10) and two fasteners (20). The body (10) has a long slot (11) and two ends (not numbered). Each end extends perpendicular to the long slot (11) and is formed into a standing pivot seat (100). Each fastener (20) is pivotally connected to the pivot seat (100) to hold the memory module (30) (not shown in FIG. 1) in the long slot (11) of the body (10).

Figure 2:
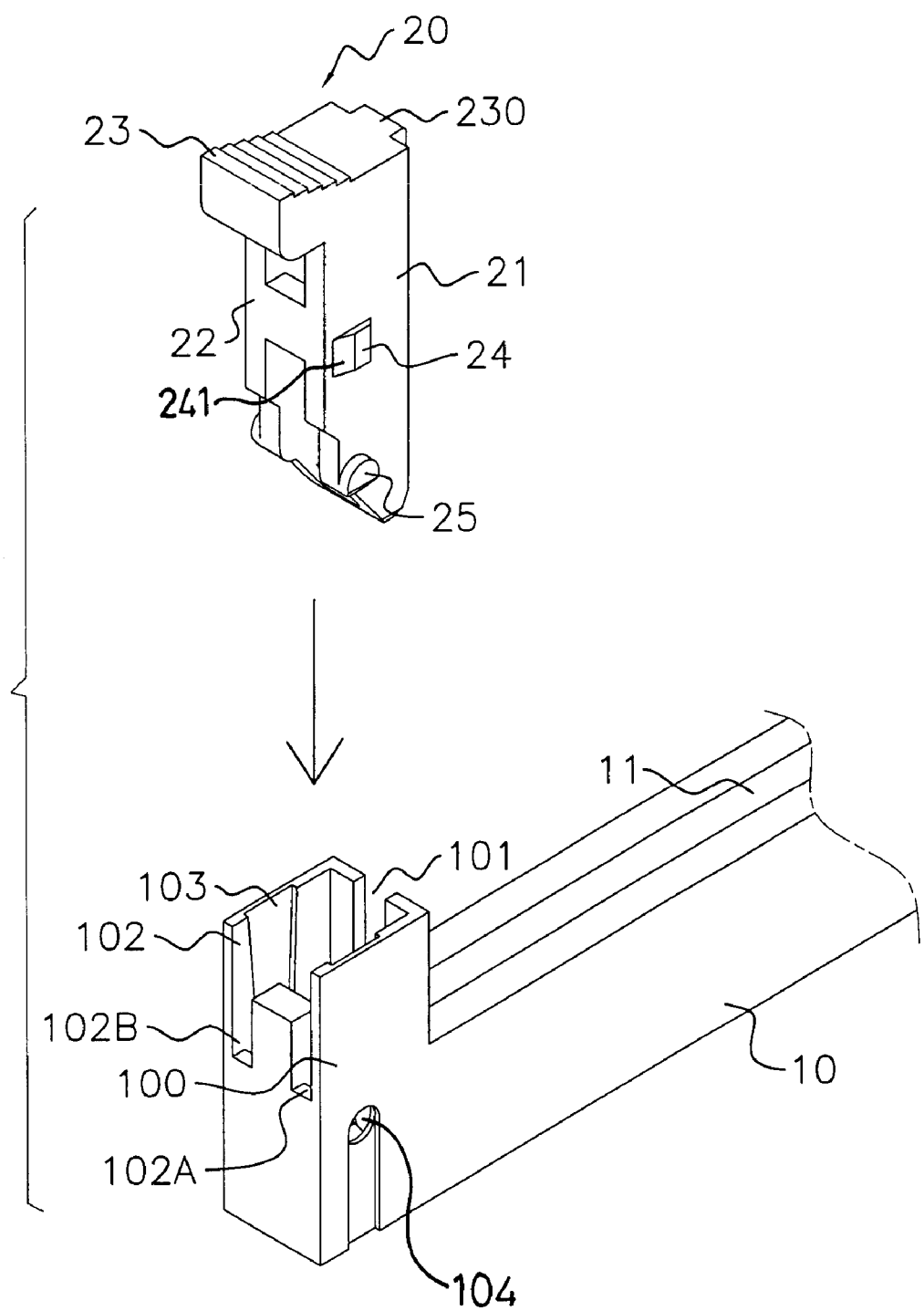
FIG. 2 is an enlarged exploded perspective view of one end of the connector assembly in FIG. 1.

With further reference to FIG. 2, the pivot seat (100) is a hollow cuboid. Each pivot seat (100) has an inner side (not numbered), an outer side (not numbered), a front wall (not numbered) and a rear wall (not numbered). The front and rear walls respectively have an inner face (not numbered). The inner side faces toward the long slot (11), and the outer side is opposite to the inner side. A first opening (101) is defined in the inner side, and a second opening (102) is defined in the outer side. The second opening (102) is an inverted-U shape with two parallel through slots (102A, 102B). Two recessed guides (103) are respectively defined on the two inner faces of the front and rear walls of the pivot seat (100) and have a depth. Two pivot holes (104) are respectively defined through the front and rear walls of the pivot seat (100) and communicate with the recessed guides (103).

The fastener (20) is adapted to be mounted in the pivot seat (100). The fastener (20) is an elongated cuboid and has a distal end, a pivoting end, a front wall (21), a rear wall (22), a thumb tab (23) formed on the distal end and a protruding ear (230) facing toward the first opening (101). The thumb tab (23) and the protruding ear (230) extend from opposite sides between the inner faces of the front and rear faces of the pivot seat (100). A protruding detent (24) and a pivot pin (25) are formed on both the front and rear walls (21, 22) in a vertical line corresponding to the recessed guide (103). Each protruding detent (24) is a trapezoidal shape and has left and right inclined edges (241) and a thickness (not numbered). The pivot pin (25) is a semicircular protrusion. The protruding detents (24) are thicker than the depth of the recessed guide (103). The pivot pins (25) are longer than the thickness of the protruding detents (24).

Figure 3:
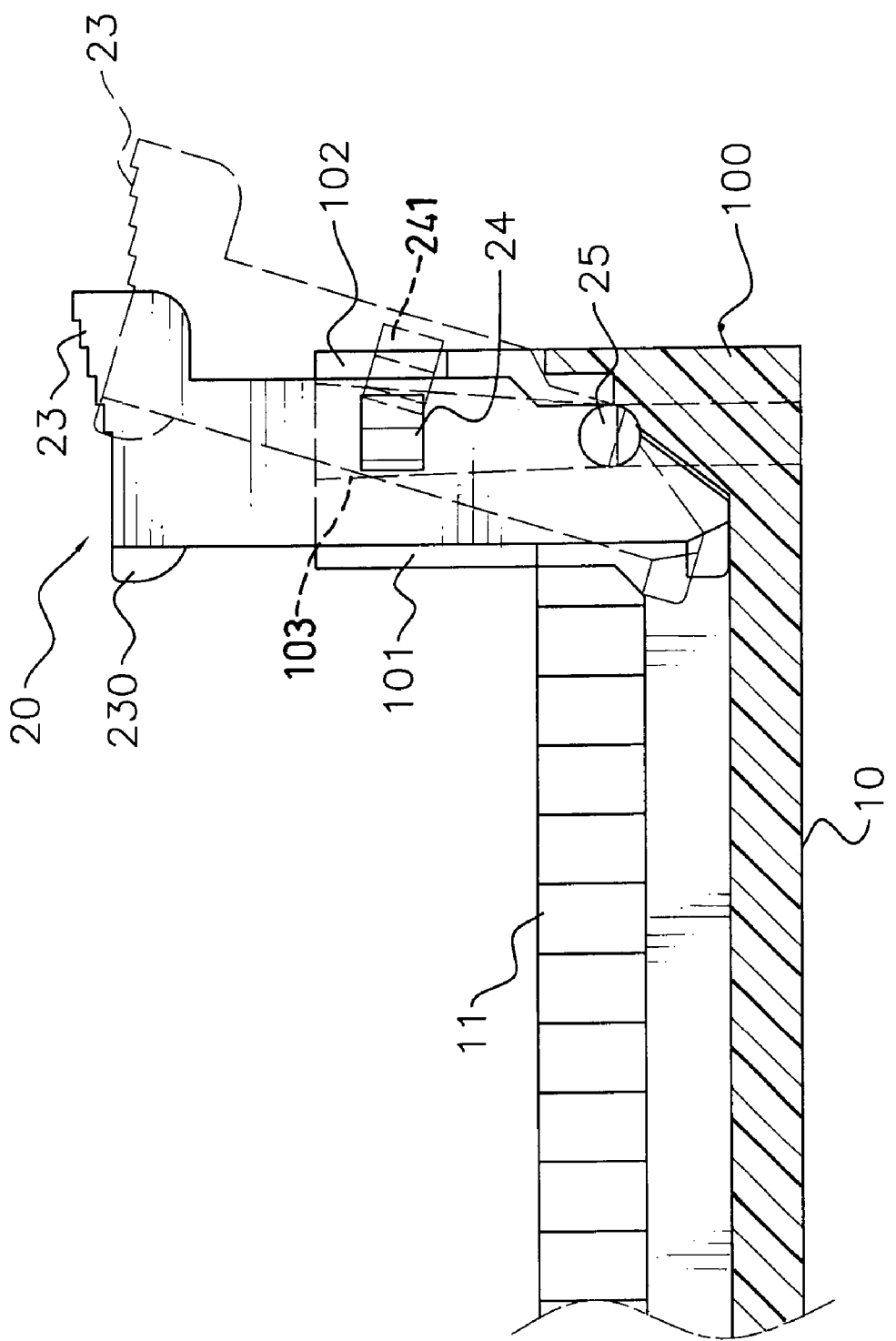
FIG. 3 is an enlarged operational front view of the connector assembly in FIG. 1.
Figure 4:
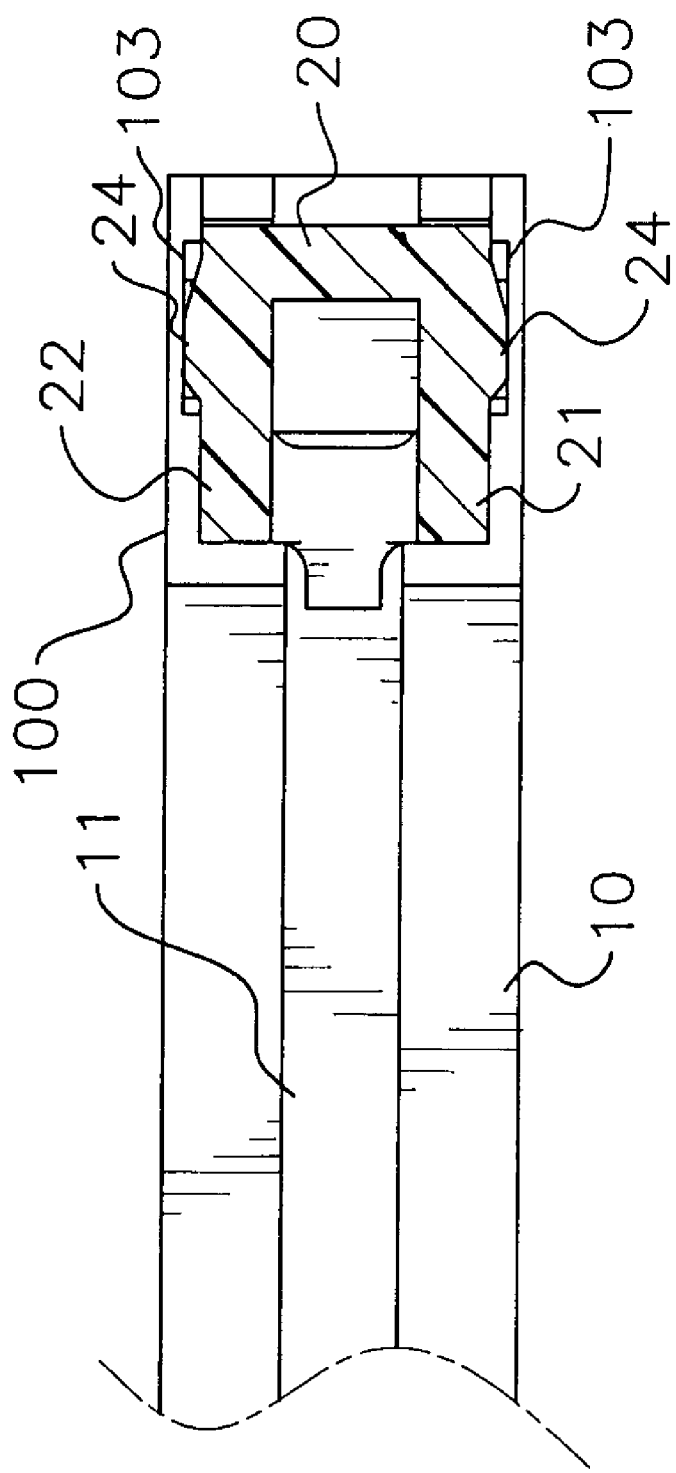
FIG. 4 is a top view of the connector assembly in FIG. 3.

With further reference to FIG. 3, the fastener (20) is installed in the pivot seat (100) by aligning the two pivot pins (25) of the fastener (20) with the two recessed guides (103) in the pivot seat (100). The fastener (20) is pressed into the pivot seat (100) along the two recessed guides (103) until the two pivot pins (25) are inserted into the two pivot holes (104). With farther reference to FIG. 4, the two protruding detents (24) press against the recessed guides (103). Each of the front wall (21) and the rear wall (22) of each fastener (20) has a long upper edge (not numbered) and a short lower edge (not numbered). The short lower edges correspond to the two parallel through slots (not numbered) respectively. When the thumb tab (23) is pivoted outward, the two short lower edges move into the through slots, and the two protruding detents (24) and the protruding ear (230) move outward, too. The protruding detents (24) can successfully leave the corresponding recessed guide (103) because of the inclined edges (241).

Figure 6:
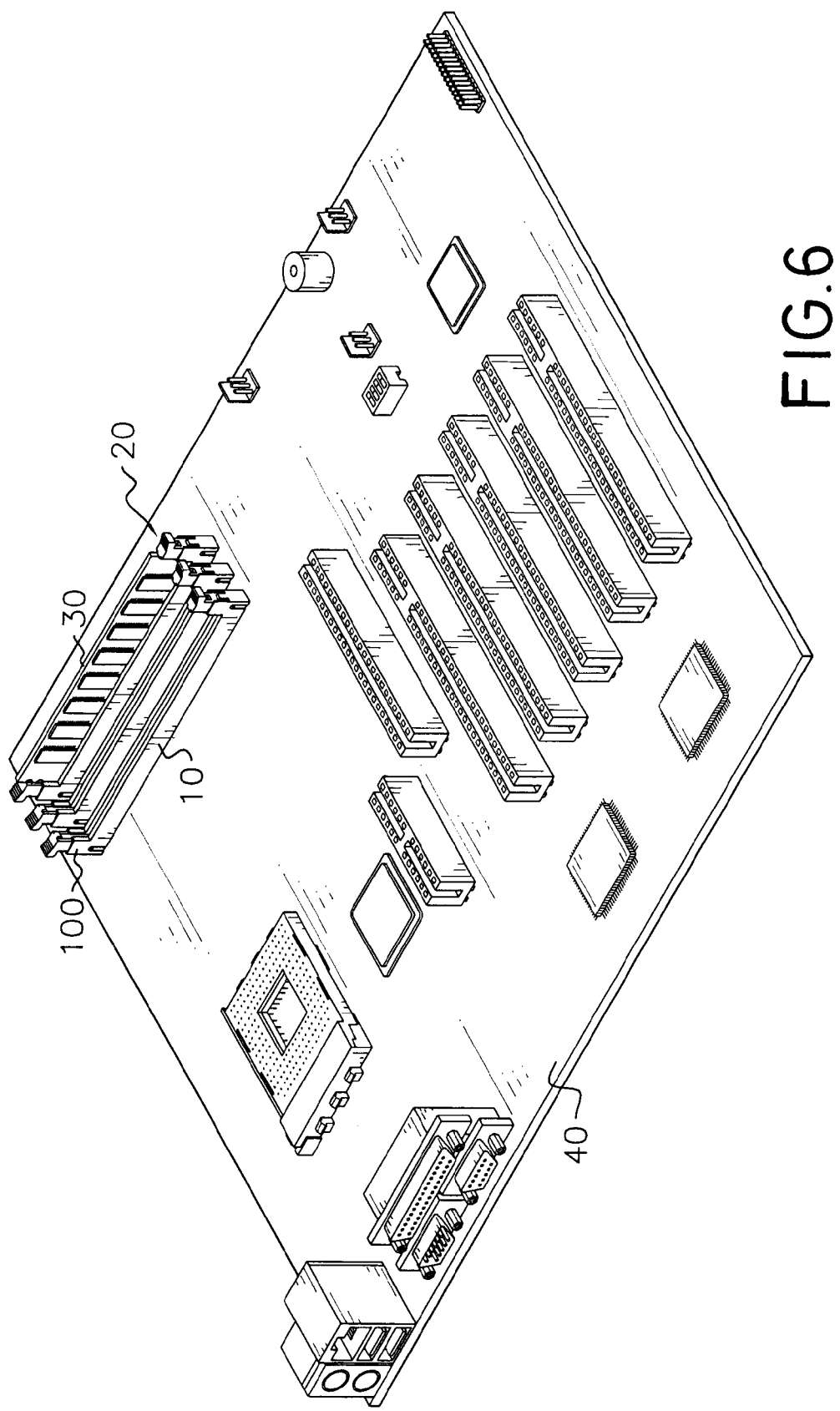
FIG. 6 is a perspective view of the connector assembly in FIG. 5 on a main circuit board.

With further reference to FIG. 5, the knife edge of the AGP memory module (30) can be inserted into the long slot (11) of the body (10). When the memory module (30) is inserted into the long slot (11), the thumb tab (23) is pivoted to press the protruding ear (230) into the semicircular notch (31). The protruding detents (24) (not shown in FIG. 5) are also moved into the recessed guides (103) to hold the fastener (20) in position. With reference to FIG. 6, the connector assemblies are mounted on a main circuit board (40).

Based on the forgoing description, a memory module is easily inserted into the connector assembly, and the connector assembly securely holds the memory module.

Even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A connector assembly for a memory module, comprising:
   a body suitable to hold the memory module, wherein the body has a slot and two ends with a standing pivot seat formed on and extending from each end, wherein each standing pivot seat comprises
   an inner side and an outer side, where the inner side faces the slot; and
   a front wall and a rear wall respectively having an inner face, wherein two recessed guides are respectively defined on the inner faces of the front and rear walls and two through pivot holes are defined in the front and rear walls and respectively communicate with the two recessed guides; and
   two fasteners, wherein each fastener comprises
   a distal end and a pivoting end;
   a front wall and a rear wall corresponding to the two recessed guides in the standing pivot seat; and
   a protruding detent and a pivot pin formed on each of the front and rear walls, wherein the pivot pins of the fastener are inserted into the through pivot holes of the pivot seat to pivotally connect the fastener to the pivot seat, with the protruding dents of the fastener received in the two recessed guides of the pivot seat to bold the fastener in position and leaving the recessed guides when the fastener is pivoted relative to the pivot seat about the pivot pins.

2. The connector assembly as claimed in claim 1, wherein the inner side of each standing pivot seat further comprises a first opening and the outer sides of each standing pivot seat further comprises a second opening, wherein the second opening is an inverted-U shape having two parallel through slots in the outer side;
   an outer side of each of the front and rear walls of each fastener has a short lower edge, wherein the two short lower edges correspond to the two parallel through slots in the second openings; and
   each fastener further comprises
   a thumb tab formed on the distal end of the fastener; and
   a protruding ear extending from the thumb tab and facing the first opening, wherein the protruding ear is suitable to engage a notch on one end of the memory module.

3. The connector assembly as claimed in claim 2, wherein the protruding detents and pivot pins on the front and rear walls of each fastener are in a vertical line relative to and aligned with the corresponding recessed guide, wherein the protruding detent is higher than the pivot pin.

4. The connector assembly as claimed in claim 1, wherein the protruding detent is a trapezoidal shape and has left and right inclined edges for engaging with sides of the corresponding recessed guide when the protruding detent is received in the corresponding recessed guide.

5. The connector assembly as claimed in claim 1, wherein the pivot pin is semicircular.

6. The connector assembly as claimed in claim 1, wherein the protruding detent is thicker than a depth of the recessed guide and a thickness of the pivot pin is bigger than a thickness of the protruding detent.

7. The connector assembly as claimed in claim 3, wherein the protruding detent is a trapezoidal shape and has left and right inclined edges for engaging with sides of the corresponding recessed guide when the protruding detent is received in the corresponding recessed guide.

8. The connector assembly as claimed in claim 7, wherein the pivot pin is semicircular.

9. The connector assembly as claimed in claim 8, wherein the protruding detent is thicker than a depth of the recessed guide and a thickness of the pivot pin is bigger than a thickness of the protruding detent.

10. The connector assembly as claimed in claim 1, wherein the protruding detents and pivot pins on the front and rear walls of each fastener are in a vertical line relative to and aligned with the corresponding recessed guide, wherein the protruding detent is higher than the pivot pin.

11. The connector assembly as claimed in claim 10, wherein the protruding detent is a trapezoidal shape and has left and right inclined edges for engaging with sides of the corresponding recessed guide when the protruding detent is received in the corresponding recessed guide.

12. The connector assembly as claimed in claim 11, wherein the pivot pin is semicircular.

13. The connector assembly as claimed in claim 12, wherein the protruding detent is thicker than a depth of the recessed guide and a thickness of the pivot pin is bigger than a thickness of the protruding detent.

14. The connector assembly as claimed in claim 4, wherein the protruding detent is thicker than a depth of the recessed guide and a thickness of the pivot pin is bigger than a thickness of the protruding detent.

15. The connector assembly as claimed in claim 4, wherein the pivot pin is semicircular.

16. The connector assembly as claimed in claim 5, wherein the protruding detent is thicker than a depth of the recessed guide and a thickness of the pivot pin is bigger than a thickness of the protruding detent.

17. The connector assembly as claimed in claim 2, wherein the protruding detent is a trapezoidal shape and has left and right inclined edges for engaging with sides of the corresponding recessed guide when the protruding detent is received in the corresponding recessed guide.

18. The connector assembly as claimed in claim 17, wherein the pivot pin is semicircular.

19. The connector assembly as claimed in claim 18, wherein the protruding detent is thicker than a depth of the recessed guide and a thickness of the pivot pin is bigger than a thickness of the protruding detent.

20. The connector assembly as claimed in claim 2, wherein the protruding detent is thicker than a depth of the recessed guide and a thickness of the pivot pin is bigger than a thickness of the protruding detent.

* * * * *